United States Patent
Ogawa et al.

(10) Patent No.: US 6,849,934 B2
(45) Date of Patent: Feb. 1, 2005

(54) DIELECTRIC FILM FOR PRINTED WIRING BOARD, MULTILAYER PRINTED BOARD, AND SEMICONDUCTOR DEVICE

(75) Inventors: Makoto Ogawa, Okayama (JP); Akira Urakami, Okayama (JP); Kazuhiko Ohashi, Okayama (JP)

(73) Assignee: Japan Gore-Tex, Inc., Tokyo (JP)

( * ) Notice: Subject to any disclaimer, the term of this patent is extended or adjusted under 35 U.S.C. 154(b) by 153 days.

(21) Appl. No.: 10/382,356

(22) Filed: Mar. 5, 2003

(65) Prior Publication Data

US 2003/0219588 A1 Nov. 27, 2003

(51) Int. Cl.$^7$ ............................................. H01L 23/02
(52) U.S. Cl. ...................... 257/678; 257/687; 257/723; 257/778
(58) Field of Search ................................ 257/678, 687, 257/688, 723, 778, 787, 792; 438/108; 361/762, 771, 783

(56) References Cited

U.S. PATENT DOCUMENTS

| | | | | |
|---|---|---|---|---|
| 5,034,801 A | * | 7/1991 | Fischer | 257/687 |
| 5,349,155 A | * | 9/1994 | Yamagishi et al. | 219/121.71 |
| 6,191,952 B1 | * | 2/2001 | Jimarez et al. | 361/771 |
| 6,297,459 B1 | * | 10/2001 | Wojnarowski et al. | 174/255 |
| 6,586,827 B2 | * | 7/2003 | Takeuchi et al. | 257/687 |
| 2004/0104463 A1 | * | 6/2004 | Gorrell et al. | 257/686 |

FOREIGN PATENT DOCUMENTS

| | | |
|---|---|---|
| JP | 2-296389 | 12/1990 |
| JP | 3-68149 | 3/1991 |
| JP | 4-229584 | 8/1992 |
| JP | 4-363032 | 12/1992 |
| JP | 1997046012 | 2/1997 |
| JP | 1998064927 | 3/1998 |
| JP | 2000144072 | 5/2000 |
| JP | 2001298272 | 10/2001 |

* cited by examiner

Primary Examiner—Tuan H. Nguyen
(74) Attorney, Agent, or Firm—Allan M. Wheatcraft

(57) ABSTRACT

A dielectric film for a printed wiring board that has excellent heat resistance, moisture resistance, insulation properties, adhesiveness, ease of handling, ease of processing, and the like, and possesses low elasticity and high elongation as stress relief functions. The dielectric film has drawn porous polytetrafluoroethylene used as the base material; this is impregnated with an adhesive or fusible resin; the post-solidification tensile modulus of elasticity is 0.1 to 1.8 GPa; and the tensile elongation at break (at 25° C.) is at least 4.0%. A semiconductor device, comprising a multilayer printed board having a plurality of circuit layers, and a semiconductor element mounted on the multilayer printed board, this semiconductor device having an insulating/adhesive layer with a stress relief function between the outermost circuit layer of the multilayer board on the side of the semiconductor element, and the circuit layer adjacent thereto; and the insulating/adhesive layer is formed from the dielectric film. Also, a printed wiring board therefor.

5 Claims, 3 Drawing Sheets

[Figure 1]
[Figure 2]
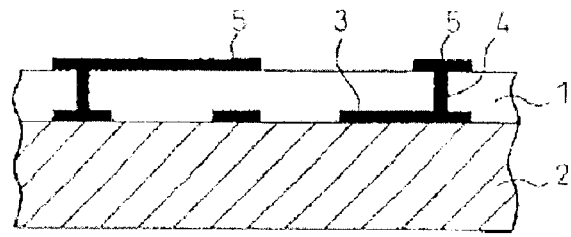
[Figure 3]
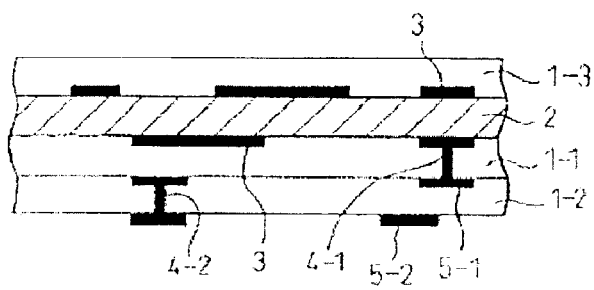
[Figure 4]
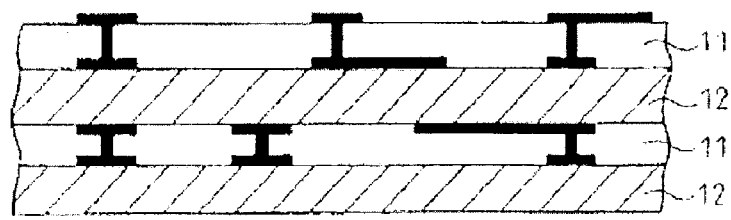
[Figure 5]
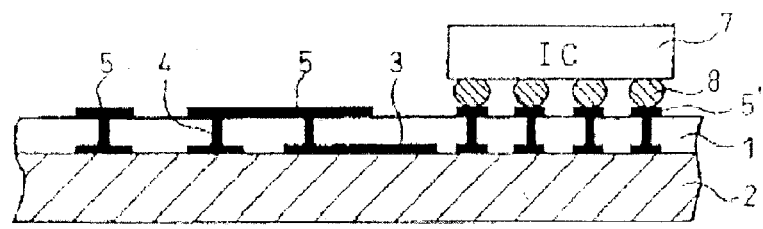

[Figure 6]
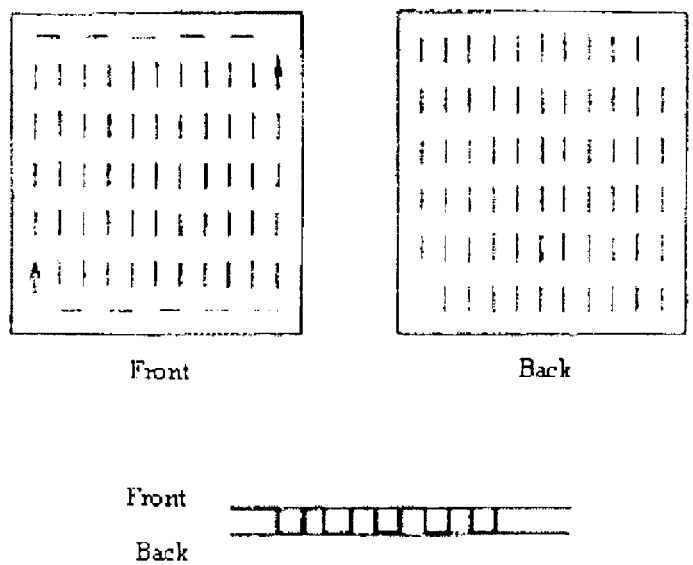
Front       Back
Front
Back
[Figure 7]
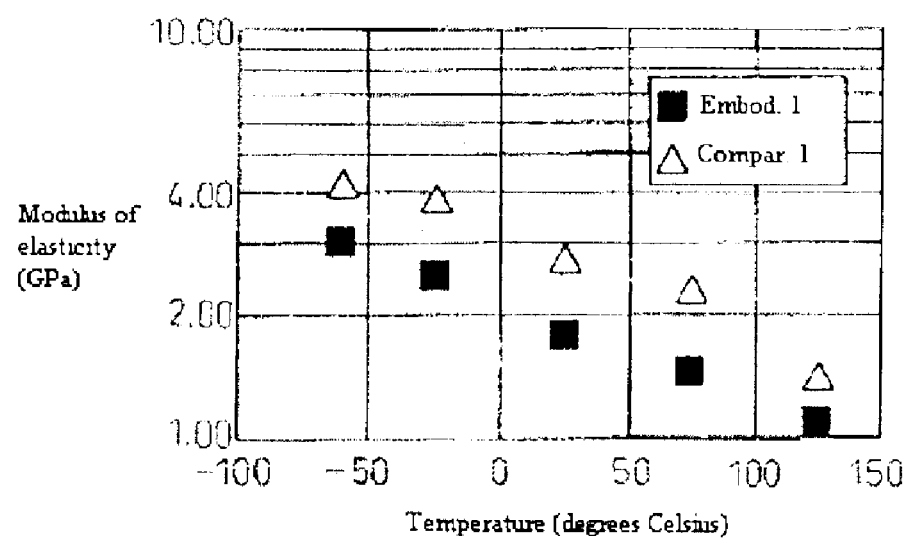

[Figure 8]
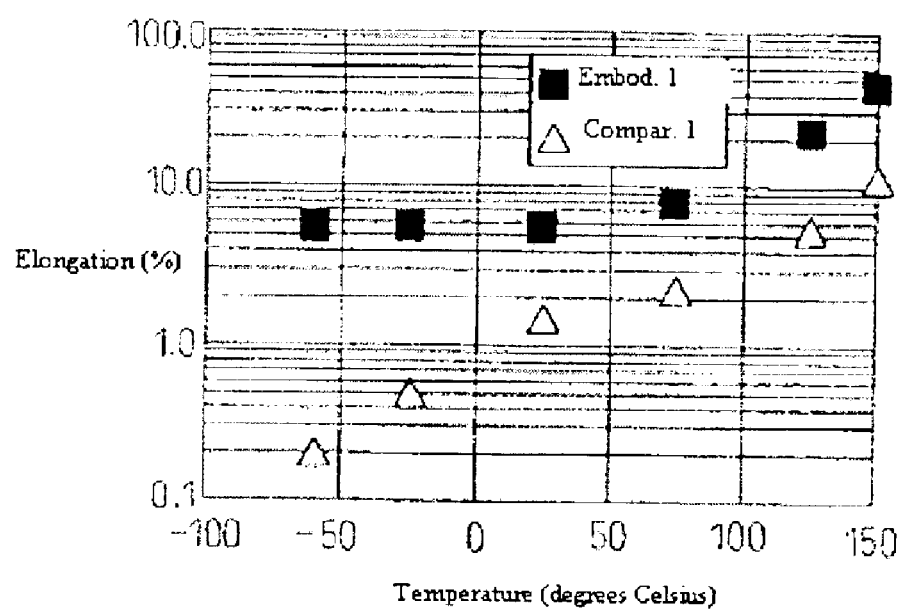

DIELECTRIC FILM FOR PRINTED WIRING BOARD, MULTILAYER PRINTED BOARD, AND SEMICONDUCTOR DEVICE

FIELD OF THE INVENTION

The present invention relates to a dielectric film for a printed wiring board, a printed wiring board, and a semiconductor device, and in particular to a stress-relief dielectric film for a printed wiring board, a printed wiring board, and a semiconductor device in which the joints between a flip-chip mounted semiconductor chip and the printed wiring board are prevented with high efficiency from peeling or cracking by using a drawn porous polytetrafluoroethylene film as the starting material on the side on which the multilayer printed board is bonded to the semiconductor chips, and using a low-elasticity, high-elongation insulating adhesive layer obtained by impregnating this material with resin. The stress-relief dielectric film of the present invention can be widely used in the surface layers of build-up wiring boards, internal layers of laminates, various stress relief layers, and the like.

BACKGROUND OF THE INVENTION

In conventional practice, undesirable thermal stress develops because of differences in the coefficient of thermal expansion between the mounting board and semiconductor element of flip-chip semiconductor device or when surface-mounted electronic components are mounted on mounting boards such as chip size packages (CSP). Specifically, the drawback is that when a semiconductor element is mounted on a mounting board, cracking is induced in the semiconductor element or mounting board by the thermal stress generated between the semiconductor element and the mounting board, or peeling occurs in the soldered joints between the mounting board and the semiconductor element.

To overcome this drawback, methods have been developed in which a buffer portion for reducing the thermal stress is provided on the side of the package on which the semiconductor element is mounted, and excessive stress is prevented from developing in the semiconductor element. Examples of such methods include those in which a semiconductor element is mounted on a board via a buffer layer formed from an elastomer or other buffer material in the form of a film (for example, JP (Kokai) 4-363032, 10-64927, and 2001-298272); and those in which connection terminals connected to the electrodes of semiconductor elements are formed from wires to render the connection terminals elastic and to allow them to be deformed. There are also methods in which joints between the semiconductor elements and multilayer board are packed with an underfiller to fix the semiconductor elements in place following mounting.

Some substrate boards are fabricated by forming an insulating layer from resin alone, but such resin films, in addition to problems associated with insulation properties, heat resistance, and peel strength characteristics, also have problems associated with film cracking during film forming or film winding, particularly in the case of epoxy resins. It is known that resin cracking and other such drawbacks can commonly be overcome if acrylonitrile-butadiene rubber is added to the resin component to reduce its modulus of elasticity, but because problems related to moisture resistance and heat resistance are encountered when the rubber is added in a large amount, it is impossible to obtain viable substrate boards merely by adding rubber to resin. It can also be indicated that because a film composed of resin alone does not have a base material, the flowability of the resin is difficult to control, and problems are encountered in terms of thickness accuracy and insulation properties during lamination and processing.

Because of considerations related to impedance control and the like, the thickness of the insulating material in current substrate boards (multilayer printed boards) must be set to a value designed by computer simulation. High accuracy is therefore needed in terms of uniform thickness, composition, and the like. Currently there are products in which a polyimide, a film composed of resin alone, or the like is used as the core layer, and this layer is coated on both sides with a resin (JP (Kokai) 2000-144072), but it has been pointed out that these products fail to satisfy high reliability attributes such as material uniformity and resin flowability.

Thus, all the printed wiring boards designed in accordance with the prior art have drawbacks, and measures designed to ensure the desired level of reliability in solder joints are becoming increasingly more vital as semiconductor chips are bonded with solder over smaller areas in response to the miniaturization of semiconductor devices.

JP (Kokai) 9-46012 discloses, as an item related to the present invention, a flexible wiring board obtained using an adhesive layer with a low modulus of elasticity, itself obtained by curing a thermoplastic porous resin film after it has been impregnated with a thermosetting resin composition that has a low modulus of elasticity. In this invention, however, a low-elasticity adhesive layer is used in order to prevent flexible boards from warping, and this layer cannot be utilized to prevent cracking from developing between a rigid board and a semiconductor element when this element is mounted on the board in the same manner as in the present invention.

An object of the present invention is to provide a stress-relief dielectric film in which drawn porous polytetrafluoroethylene whose structure remains flexible across a variety of temperature regions is used as a base material, whereby the dielectric film is provided with characteristics such as reduced modulus of elasticity and increased elongation; solder can be directly used to form joints when employed to connect boards and semiconductor elements normally affected by expansion and contraction caused by thermal stress, metal fatigue caused by such repeated expansion and contraction, and other problems; the semiconductor elements, solder joints, and boards are prevented from cracking even without the use of a conventionally employed underfill material or other connection-forming material; the flexible characteristics of the board are utilized; post-pressing thickness accuracy can be ensured together with adequate embedding properties that allow internal-layer circuitry to be firmly held in place; excellent insulation properties, adhesion, and reliability are achieved; handling is improved during film winding and processing; and higher productivity can be ensured; and also to provide a printed wiring board and a semiconductor device in which this film is used.

SUMMARY OF THE INVENTION

A drawn porous polytetrafluoroethylene film whose structure remains flexible across a variety of temperature regions is used as a base material, and a low-elasticity, high-elongation resin is combined therewith, thereby providing a dielectric film for a printed wiring board comprising a dielectric layer that has a low-elasticity, high-elongation stress relief function and possesses excellent heat resistance, moisture resistance, insulation properties, adhesiveness, ease of handling, ease of processing, and the like.

The prepreg for the stress-relief dielectric is used for the external layer, and optionally the internal layer, of a printed wiring board (substrate board) during board fabrication, thereby providing a high-performance substrate board that has high thickness accuracy and is capable of successfully delivering the designed performance.

A semiconductor device in which there is no need to position a buffer layer or underfill material between the IC and the board, and in which the semiconductor elements, solder joints, and board are prevented from developing cracks by fabricating the semiconductor device such that the IC is mounted in the device by using the stress-relief dielectric film for the outermost layer of the substrate board.

A drawn porous polytetrafluoroethylene film is used as the base material, and a low-elasticity, high-elongation resin is combined therewith, thereby providing a stress-relief dielectric film in which the post-solidification tensile modulus of elasticity is 0.1 to 1.8 GPa and the tensile elongation at break (at 25° C.) is 4.0% or greater, and hence yielding considerable elongation at the temperatures, and low temperatures in particular, maintained during the heat cycle tests commonly performed to test the reliability of printed wiring boards, so the stress generated in semiconductor elements, boards, and the like when these components are expanded and contracted by heat can be relieved and a highly reliable semiconductor device created; and also providing a substrate board and semiconductor device in which this is used.

BRIEF DESCRIPTION OF THE DRAWING

FIG. 1 depicts a dielectric film according to an exemplary embodiment of the present invention.

FIG. 2 depicts a printed wiring board obtained using a dielectric film according to an exemplary embodiment of the present invention.

FIG. 3 depicts a printed wiring board built up using a dielectric film according to an exemplary embodiment of the present invention.

FIG. 4 depicts a printed wiring board obtained by the alternate lamination of a core material and a dielectric film according to an exemplary embodiment of the present invention.

FIG. 5 depicts a semiconductor device obtained using a dielectric film according to an exemplary embodiment of the present invention.

FIG. 6 depicts a daisy chain pattern of the heat cycle test.

FIG. 7 depicts a tensile moduli of elasticity of dielectric films of exemplary embodiments of the present invention and a conventional example.

FIG. 8 depicts the tensile elongations at break of the dielectric films of exemplary embodiments of the present invention and a conventional example.

DETAILED DESCRIPTION OF THE INVENTION

Aimed at addressing the above-described problems of the prior art, the present invention allows the elasticity of a dielectric film (solidified) to be reduced by using a drawn porous polytetrafluoroethylene film as a base material, and compositing a low-elasticity and high-elongation resin therewith.

Examples of the principal ingredients used as resins on this occasion include, but are not limited to, cresol novolak epoxy resin, phenol novolak epoxy resin, bisphenol A-type epoxy resin, bisphenol F-type epoxy resin, alcohol ether-type epoxy resin, glycidylamine-type epoxy resin, polyimide resin, and other thermosetting resins; and polycarbonate resin, bismaleimide/triazine resin, silicone resin, melamine resin, urea resin, diallyl phthalate resin, unsaturated polyester resin, nylon resin, polyester resin, and other thermoplastic resins. These principal ingredients may be used singly, or a plurality of them may be combined freely.

Examples of curing agents that can be used as needed include, but are not particularly limited to, 2-methylimidazole, 2-methyl-4-ethylimidazole, 2-phenylimidazole, dimethylaminomethyl phenol, benzyldimethylamine, methyldianiline, diethylenetriamine, dicyandiamide, alkyleneamines, and organic acid anhydrides. These may be used singly, or a plurality of them may be combined freely.

Because the present invention entails impregnating a drawn porous polytetrafluoroethylene base material with resin and bringing the post-solidification tensile modulus of elasticity to 0.1–1.8 GPa and the elongation to 4% or greater, a resin that can yield these characteristics is selected from the aforementioned resins or is specially synthesized for such use. Alternatively, these characteristics can be obtained by adding an elastomer or other such material for reducing the modulus of elasticity to the resin in accordance with the present invention. Acrylonitrile-butadiene copolymer (CTBN) can be cited as an example of the elastomer used on this occasion. The additive is introduced in an amount of 30 mass % or less, preferably 20 mass % or less, and particularly preferably 15 mass % or less, in relation to the total amount of resin. A greater amount reduces the modulus of elasticity of the dielectric film but has an adverse effect on the moisture resistance and other physical properties.

In conventional practice, it has been proposed to use drawn porous polytetrafluoroethylene as part of a semiconductor chip package (JP (Kokai) 3-68149 and 4-229584) or as part of the board as well (JP (Kokai) 2-296389). These measures, however, are primarily aimed at lowering the dielectric constant of the drawn porous polytetrafluoroethylene and are not concerned with making the solder bonding of prepregs more secure through a stress relief function. Consequently, conventional drawn porous polytetrafluoroethylene sheets have a post-solidification tensile modulus of elasticity of 2 to 3 GPa even after being impregnated with resin, and no intention is made to bring this characteristic to 0.1–1.8 GPa and to establish an elongation of 4% or greater in the manner proposed by the present invention. Furthermore, the tensile modulus of elasticity is as high as 5 to 10 GPa in the insulating layers for multilayer printed boards in which glass cloth is used as the base material. The present invention is based on the discovery of a unique property whereby an excellent stress relief function is maintained across a wide range of temperatures, from low to high, by using drawn porous polytetrafluoroethylene as the base material and impregnating this material with a low-elasticity, high-elongation resin.

The dielectric film for a printed wiring board of the present invention has a post-solidification tensile modulus of elasticity of 0.1 to 1.8 GPa, and preferably 0.3 to 1.5 GPa. Keeping the tensile modulus of elasticity below 0.1 GPa fails to provide the board surface with sufficient rigidity and makes the board difficult to process when semiconductor elements are mounted on the board or the like. Exceeding 1.8 GPa reduces the stress relief effect and causes peeling and cracking to occur in solder joints and the like when IC chips are mounted using solder. The dielectric film (solidified) of the present invention has a feature whereby a low tensile modulus of elasticity is maintained even at the temperature of liquid nitrogen. (In the embodiment shown in FIG. 7, the tensile modulus of elasticity at the temperature of liquid nitrogen is about 3.0 GPa.)

The dielectric film for a printed wiring board of the present invention has a post-solidification tensile elongation at break (at 25° C.) of at least 4.0%, preferably at least 5.0%, and more preferably at least 6.0%. At less than 4.0%, thermal stress can still be avoided because of the low modulus of elasticity when this type of stress develops, but cracks propagate from the connections between the wiring layer and the board because of inadequate elongation. The dielectric film (solidified) of the present invention has a feature whereby a tensile elongation at break of at least 4.0% can be maintained even at the temperature of liquid nitrogen. (In the embodiment shown in FIG. 7, the elongation at the temperature of liquid nitrogen is about 5.5%.)

The tensile modulus of elasticity and tensile elongation at break are thus important elements of the present invention, but the coefficient of thermal expansion of the dielectric film (solidified) for a printed wiring board of the present invention should also be taken into account, and the coefficient of linear expansion preferably kept at 100 ppm or less, to make the film into a more reliable crack-resistant material during flip-chip mounting or the like.

An inorganic filler may also be added to the dielectric film of the present invention as long as the essence of the present invention is not compromised. Examples of such inorganic fillers include silica powder, alumina, talc, calcium carbonate, titanium white, kaolin clay, iron oxide, magnesium hydroxide, aluminum hydroxide, calcium hydroxide, dawsonite, calcium aluminate, and zinc borate. Enhanced dimensional stability, and a reduced coefficient of linear expansion in particular, can be expected to result from the introduction of the inorganic filler. The inorganic filler is added in an amount that corresponds to a packing ratio of 5.0% to 60.0%, and preferably 10.0% to 50.0%, in relation to the total amount of resin. Keeping the packing ratio below 10% or above 50% is disadvantageous because in the first case the dimensional stability effect cannot be fully utilized, and in the second case the peel strength of the copper foil becomes inadequate because of an insufficient amount of resin.

A surfactant or the like may also be added besides the elastomer and inorganic filler to obtain the desired resin composition as long as the essence of the present invention is not compromised.

The drawn porous polytetrafluoroethylene base material used in the present invention is fashioned to a thickness of 5 to 500 μm, and preferably 10 to 300 μm. A thin material of less than 10 μm is unlikely to have adequate strength, whereas exceeding 300 μm creates problems in terms of utilizing the laminated board. Pores are also formed in order to allow the base material film to be impregnated with the resin, at a porosity of 10 to 95%, and preferably 50 to 90%. Keeping the porosity below 50% has an adverse effect on adhesiveness and fusibility because of an insufficient amount of resin, whereas excessively high porosity makes it impossible to utilize the characteristics of the flexible base material and results in an inadequate tensile elongation at break. The weight proportion of the base material and the resin is preferably 5.0% to 40.0% of the base material in relation to the total amount of dielectric film. Keeping the weight proportion below 5.0% makes it impossible to utilize the characteristics of the flexible base material and results in an inadequate tensile elongation at break, whereas keeping the proportion above 40.0% has an adverse effect on adhesiveness and fusibility because of an insufficient amount of resin.

The present invention is the result of a discovery that using drawn porous polytetrafluoroethylene as a base material and impregnating this material with a low-elasticity, high-elongation resin make it possible to provide high reliability across a wide range of temperatures, from low to high, due to the unique microporous structure (structure in which fibrils are connected by nodes) and properties of the drawn porous polytetrafluoroethylene. In conventional resin products or the like, strength, durability, and other physical properties decline if the modulus of elasticity is reduced, but products obtained using drawn porous polytetrafluoroethylene as the base material are free from this type of drawback. As a result, it was discovered that a drawn porous polytetrafluoroethylene impregnated with a low-elasticity, high-elongation resin, when used as an insulating layer (external layer) underneath the outermost circuit layer of a rigid printed wiring board even without the separate introduction of a special functional layer, such as the stress relief layer of the prior art, between the semiconductor element and the multilayer board, has the surprising effect of being able to function as a stress relief layer that can adequately preserve solder joints while constituting part of the insulating layer of the multilayer board, and of even making it possible to dispense with the underfill (resin impregnation) commonly for the solder joints of a semiconductor element.

The base material can be impregnated with resin by a common method used in the production of dielectric films, such as one in which the components used in the present invention are diluted to an appropriate concentration with toluene, xylene, dimethylformamide, dibutyl phthalate, dioctyl phthalate, polyethylene glycol, methyl alcohol, ethyl alcohol, isopropyl alcohol, tetrahydrofuran, acetone, methyl ethyl ketone, 2-methoxyethanol, or another organic solvent suited to the objects of the present invention; a varnish is prepared from the diluted components; the drawn porous polytetrafluoroethylene base material is coated and impregnated with the varnish; and the coated material is dried; or by a heat melting and impregnation method in which the varnish is rendered less viscous by the application of heat, and impregnation is then performed. In the process, a dielectric film (prepreg) 1 in a semicured state (stage B) can be fabricated by compounding a starting material and resin, and drying the compound at a temperature of about 100° C. to 200° C. for about 2 minutes to 20 minutes (FIG. 1). In addition, a product in which the base material is not only impregnated but is also covered on the surface with resin can be fabricated by expanding the steps for fabricating such a dielectric film to include steps in which the completed dielectric film (solidified film) is recoated with a varnish and dried.

The prepreg product may be in the form of a product in which the base material is impregnated with a resin composition, or a product in which the resin is used to coat the surface in addition to impregnating the material. Each type of product has its distinctive features. An uncoated product has high thickness accuracy because of the minimal resin flow during press or heat molding, whereas the advantage of a coated product is that the resin flows readily during press or heat molding, making it easier to embed a wiring layer.

A printed wiring board can be produced by laminating the dielectric film obtained by this method onto a rigid core element 2. The core element may be a product obtained by the compounding of resin with glass, organic fibers, or another base material. Ceramics, glass, an organic film that has high dimensional stability, or the like may also be used. The lamination method may involve pressing, lamination with rolls, or the like; a vacuum may commonly be used in order to reduce the number of voids during lamination; and molding may be performed using heat or pressure.

When used in a multilayer printed board with a laminated structure, the present dielectric film as such has adequate properties as a dielectric layer, and can therefore be used as one or more of the internal layers and/or external layers of the laminated structure, but using the film as the outermost layer of a rigid board when constructing such a board is the most effective way of obtaining the stress relief effect of the present invention. Using the film as the outermost layer of a rigid board and mounting a semiconductor element on the overlying outermost circuit layer (electroconductive layer) will make it possible to relieve the pressure in the flip-chip joints of the semiconductor element even in the absence of an underfill, and to prevent cracking or peeling from occurring in the presence of heat cycles. "Underfilling" refers to protecting the flip-chip joints between a semiconductor element and a board from stress by filling the flip-chip joints with a resin and reinforcing these flip-chip joints with the resin. Not only does underfilling result in a cost increase, but it also adds the inconvenience of impeded resin removal in the case of bonding defects, so dispensing with this operation has a significant effect. However, the present invention does not exclude the possibility of a combined use of an underfill when necessary.

The board can be fabricated in the form of a product in which core elements and dielectric films are alternately superposed with each other (FIG. 4), in the form of a build-up board in which the present dielectric film is affixed in one or more layers on the surface of a core element (FIG. 3), or the like.

The build-up board will now be described with reference to FIG. 3. The core element 2 may itself serve as a multilayer printed board. A multilayer printed board is typically formed by the alternate lamination of copper foil layers and insulating layers obtained by impregnating glass cloth with resin. The copper layers form a circuit pattern, and the insulating layers allow the copper foil layers (circuit layers) to be electrically connected to each other via through-holes. A wiring layer pattern 5-1 is formed after through-holes 4-1 have been formed by fusing a prepreg (dielectric film) 1 to the surface circuit layer 3 of the core board 2 and subjecting the product to etching, perforation, plating, and other steps for fabricating a conventional printed wiring board. A second dielectric film 1-2 is laminated, through-holes 4-2 are formed, and the wiring pattern 5-2 of the top layer is additionally formed when one more layer is built up. Yet another layer may be built up in exactly the same manner when needed.

FIG. 4 is an example of a substrate board obtained by the alternate lamination of a core material 12 and the dielectric film 11 of the present invention.

A substrate board (for example, FIG. 2, 3, or 4) can be fabricated in this manner. A semiconductor device (FIG. 5) can be fabricated by mounting a semiconductor element on this substrate board. Referring to FIG. 5, an IC chip 7 is flip-chip bonded to bonding pads 5', which constitute part of a wiring layer 5 on the surface of a substrate board 2 in which the dielectric layer 1 of the present invention is used as the outermost layer of the board. Symbol 8 designates bonding solder. In this type of semiconductor device, the coefficients of thermal expansion are markedly different for the IC chip 7 and the board 2, so a conventional semiconductor device would have a drawback whereby cracking or peeling is induced in the solder joints by heat cycles. In conventional practice, this drawback is overcome by filling the space between the IC chip 7 and the solder pads 5' (board) with resin to reinforce the solder joints with the resin. In the present invention, however, the dielectric layer 1 that is used as the outermost layer of the board is a low-elasticity, high-elongation dielectric layer obtained by using drawn porous polytetrafluoroethylene as the base material and impregnating this material with a selected resin. It is therefore possible to obtain elasticity and elongation characteristics that remain stable across a wide range of temperatures, from low to high; to prevent cracking or peeling from being caused in the solder joints by heat cycles; and to ensure the desired moisture resistance, heat resistance, strength of solder joints, and other necessary characteristics. These desired characteristics are believed to result from the unique properties of the drawn porous polytetrafluoroethylene used as a base material, and cannot be obtained using other porous resin sheets as base materials.

EXAMPLES

Unless indicated otherwise, the numbers in the subsequent examples and comparative examples indicate parts by weight.

Example 1

70 parts of the dicyclopentadiene-type (DCPD-type) epoxy resin EPICLON HP-7200 (registered trade name, manufactured by Dainippon Ink and Chemicals), 30 parts of the novolak resin Phenolite LA-7051 (registered trade name, manufactured by Dainippon Ink and Chemicals) as a curing agent, and 0.2 part of 2-ethyl-4-methylimidazole as an effect enhancer were mixed together as principal components; methyl ethyl ketone was added to bring the nonvolatile fraction of the mixture to 50%; and the concentration was adjusted, yielding a varnish. Ten parts of drawn porous polytetrafluoroethylene (thickness: 50 $\mu$m; porosity: 65%) were impregnated with 18 parts (in terms of the nonvolatile fraction) of this varnish, and the impregnated material was dried for 3 minutes at 180° C., yielding an uncoated, semicured dielectric film with a resin content of 65% and a thickness of 50 $\mu$m.

To obtain the evaluation samples described below, four such dielectric films were laminated and heat-molded for 120 minutes at a pressure of 20 kg/m$^2$ and a temperature of 180° C., yielding a dielectric film laminate with a thickness of 0.2 mm.

Example 2

60 parts of the bisphenol A-type epoxy resin EPICLON 850 (registered trade name, manufactured by Dainippon Ink and Chemicals), 20 parts of the novolak resin Kayahard NHN (registered trade name, manufactured by Nippon Kayaku) as a curing agent, 15 parts of the acrylonitrile-butadiene rubber XER-31 (registered trade name; manufactured by JSR), and 0.3 part of 2-ethyl-4-methylimidazole as an effect enhancer were mixed together as principal com ponents; methyl ethyl ketone was added to bring the nonvolatile fraction of the mixture to 50%; and the concentration was adjusted, yielding a varnish. Ten parts of drawn porous polytetrafluoroethylene (thickness: 50 μm; porosity: 65%) were impregnated with 18 parts (in terms of the nonvolatile fraction) of this varnish, and the impregnated material was dried for 3 minutes at 180° C., yielding an uncoated, semicured dielectric film with a resin content of 65% and a thickness of 50 μm.

A sample was fabricated in the same manner as in example 1 for evaluation purposes.

Example 3

70 parts of the dicyclopentadiene-type (DCPD-type) epoxy resin EPICLON HP-7200 (registered trade name, manufactured by Dainippon Ink and Chemicals), 30 parts of the novolak resin Phenolite LA-7051 (registered trade name, manufactured by Dainippon Ink and Chemicals) as a curing agent, 0.2 part of 2-ethyl-4-methylimidazole as an effect enhancer, and 50 parts of aluminum hydroxide B1403ST (registered trade name; manufactured by Nippon Light Metal) as an inorganic filler were mixed together as principal components; methyl ethyl ketone was added to bring the nonvolatile fraction of the mixture to 50%; and the concentration was adjusted, yielding a varnish. Ten parts of drawn porous polytetrafluoroethylene (thickness: 50 μm; porosity: 65%) were impregnated with 18 parts (in terms of the nonvolatile fraction) of this varnish, and the impregnated material was dried for 3 minutes at 180° C., yielding an uncoated, semicured dielectric film with a resin content of 65% and a thickness of 50 μm.

A sample was fabricated in the same manner as in example 1 for evaluation purposes.

Comparative Example 1

Components were mixed together in accordance with the formulation shown in the table below, and the nonvolatile fraction thereof was adjusted to 50% with methyl ethyl ketone, yielding a varnish. A glass cloth WEAL 18K-107BZ (registered trade name: manufactured by Nitto Boseki) with a thickness of 0.18 mm was coated and impregnated with this varnish, and the coated cloth was dried for 8 minutes at 150° C., yielding a semicured dielectric film with a thickness of 0.20 mm in which glass cloth was used as the base material.

One such dielectric film was heat-molded for 120 minutes at a pressure of 20 kgf/m² and a temperature of 180° C. to fabricate a cured board with a thickness of 0.2 mm for evaluation purposes.

Comparative Examples 2 and 3

To fabricate comparison samples for the tests described below, a varnish prepared in accordance with the formulation shown in the table was applied in a dry film thickness of 50 μm to a copper foil 3EC-VLP-18 (registered trade name; manufactured by Mitsui Kinzoku) with a thickness of 18 μm that had been treated with a release agent, and the coated foil was dried for 8 minutes at 150° C., yielding semicured insulating adhesive films.

A resin board without a base material was obtained by pouring the varnish into a mold that had been treated with a release agent, and keeping the varnish at 180° C. for 3 hours. The resulting sample was cut to a thickness of 0.2 mm in order to perform the evaluation described below.

Comparative Example 4

Components were mixed together in accordance with the formulation shown in the table below, and the nonvolatile fraction thereof was adjusted to 50% with methyl ethyl ketone, yielding a varnish. Ten parts of drawn porous polytetrafluoroethylene (thickness: 50 μm; porosity: 65%) were impregnated with this varnish in an amount of 18 parts (in terms of the nonvolatile fraction), and the impregnated material was dried for 3 minutes at 180° C., yielding an uncoated semicured dielectric film with a resin content of 65% and a thickness of 50 μm.

A sample was fabricated in the same manner as in embodiment 1 for evaluation purposes.

Evaluation

The dielectric films, laminates, and resin boards thus fabricated were subjected to a 180° bending test (proprietary standard) to evaluate the tensile modulus of elasticity and tensile elongation at break at normal temperature (25° C.), tensile elongation at break at a low temperature (−65° C.), and TMA-based coefficient of thermal expansion in accordance with JIS Standards C 6481 and C 0025. A heat cycle test with a daisy chain pattern (−65 to 125° C.; holding for 30 minutes; 500 cycles) was also performed. The heat cycle test was performed with a daisy chain pattern in which the wiring had a width of 50 μm, the distance between adjacent wires was 50 μm (L/S=50/50), the through-hole size (via diameter) was 80 μm, the size (diameter) of the lands that connected the vias and the wires was 150 μm, the distance from one land to another (that is, the longitudinal dimension of the wiring) was 500 μm, and, finally, a 1000-hole series of holes and wires was provided, as shown in FIG. 6. The results were evaluated by passing an electric current in the direction from the arrowed position in the lower left corner to the arrow in the upper right corner of the diagram shown in FIG. 6, and determining whether conductivity was maintained after 500 cycles had elapsed. Resistance to a heat cycle load was evaluated based on the difference in the coefficient of thermal expansion between the dielectric and a copper conductor.

A semiconductor device (bare-chip mounted at a solder pad diameter of 200 μm) such as the one shown in FIG. 5 was also fabricated for the heat cycle test, and a comparison was drawn between a device obtained using a conventional dielectric film as the outermost dielectric layer, and a device obtained by forming this layer from a dielectric film pertaining to an embodiment of the present invention. Results of heat cycle tests are usually assigned a failing grade if they fail in either of two tests, but the results of the present tests were identical in all cases.

TABLE 1

(Resin amounts in parts by weight indicate nonvolatile fraction in all cases)

|  | Examples | | | Comparative Examples | | | |
| --- | --- | --- | --- | --- | --- | --- | --- |
|  | 1 | 2 | 3 | 1 | 2 | 3 | 4 |
| Base material | | | | | | | |
| Drawn porous PTFE | ○ | ○ | ○ | | | | ○ |
| Glass cloth | | | | ○ | | | |
| No base material | | | | | ○ | ○ | |
| Resin composition | | | | | | | |
| EPICLON-850 | | 60 | | 60 | 60 | 60 | 60 |
| EPICLON HP-7200 | 70 | | 70 | | | | |
| Kayahard NHN | | 20 | | 20 | 20 | 10 | 20 |
| LA-7051 | 30 | | 30 | | | | |
| 2-Methyl-4-ethylimidazole | 0.2 | 0.3 | 0.2 | 0.3 | 0.3 | 0.3 | 0.3 |
| XER-31 | | 15 | | 15 | 15 | 30 | |
| Aluminum hydroxide | | | 50 | | | | |
| Evaluation characteristics | | | | | | | |
| 180° bending test | ○ | ○ | ○ | × | × | ○ | ○ |
| Tensile modulus of elasticity (MPa) | 1500 | 1300 | 1750 | 5500 | 1700 | 1000 | 2500 |
| Tensile elongation at break (%) (25° C.) | 7.2 | 8.3 | 4.1 | 1.2 | 5.8 | 6.1 | 5.0 |
| Tensile elongation at break (%) (−65° C.) | 6.5 | 7.9 | 3.7 | 0.4 | 3.1 | 3.7 | 4.0 |
| Coefficient of thermal expansion (ppm) | 60 | 60 | 40 | 20 | 60 | 60 | 60 |
| Heat cycle test | ○ | ○ | ○ | × | × | ○ | × |
| PCT test | ○ | ○ | ○ | ○ | ○ | × | ○ |

Resin notes
EPICLON 850, bisphenol A-type epoxy resin manufactured by Dainippon Ink and Chemicals.
EPICLON HP-7200, DCPD-type epoxy resin manufactured by Dainippon Ink and Chemicals
Kayahard NHN, phenol novolak resin manufactured by Nippon Kayaku
Phenolite LA-7051, phenol novolak resin manufactured by Dainippon Ink and Chemicals
XER-31, rubber component manufactured by JSR
Aluminum hydroxide, manufactured by Nippon Light Metal Description of Evaluation Items 180° bending test: The dielectric films fabricated in the above-described embodiments and comparative examples were folded 180°, and the peeling or cracking of the films in the folds was visually observed (proprietary standard).

Tensile modulus of elasticity and tensile elongation at break at normal temperature (25° C.): Measured in accordance with JIS C 4681 using resin boards composed of resin alone, cured resin boards with glass cloth, and the laminated boards with a thickness of 0.2 mm fabricated in the aforementioned embodiments and comparative examples.

Tensile elongation at break at low temperature (−65° C.): Measured in accordance with JIS C 4681 in a thermostatic layer adjustable to −65±5° C. using resin boards composed of resin alone, cured resin boards with glass cloth, and the laminated boards with a thickness of 0.2 mm fabricated in the aforementioned embodiments and comparative examples.

Coefficient of linear expansion: Measured in accordance with JIS C 6481 by the TMA method.

Heat cycle test: Samples were kept for 30 minutes each at a low temperature (−65° C.) and high temperature (125° C.) in a thermostatic layer finely controllable from −65° C. to 125° C., a 500-cycle test was performed, and the presence of cracks, fractures, or the like was observed under a microscope.
performed, and the presence of cracks, fractures, or the like was observed under a microscope.

PCT test: Samples were exposed for 500 hours to an atmosphere of 100% relative humidity at 121° C. and 2 atm, and the presence of swelling was visually confirmed.

In the results shown in Table 1, circle signs designate a passing grade; multiplication signs, a failing grade.

Evaluation Results (1) It can be seen in Table 1 that the 180° bending test produced excellent flexibility when drawn porous polytetrafluoroethylene was used as the starting material of the dielectric film (embodiments 1 to 3, comparative example 4). Results with poor flexibility were obtained both when no base material was used and when glass cloth was used as the base material (comparative examples 1 and 2).

(2) It can be seen in Table 1 that the 180° bending test produced excellent flexibility when a large amount of rubber component (XER-31) was added (comparative example 3), even in the absence of drawn porous polytetrafluoroethylene as the base material of the dielectric film. It can also be seen, however, that the results of the PCT test were adversely affected in this case, and that a lower moisture resistance resulted.

(3) It can be seen in Table 1 that the stress relief performance was inadequate because the heat cycle test produced poor results when the tensile modulus of elasticity was greater than 1.8 GPa (comparative example 4) in a dielectric film in which drawn porous polytetrafluoroethylene was used as the starting material.

(4) The tensile modulus of elasticity and tensile elongation at break of the dielectric film of the present invention (example 1) were compared with those of a conventional example (comparative example 1) in FIGS. 7 and 8. It can be seen that the dielectric film of the present invention exhibits a low tensile modulus of elasticity and a high tensile elongation at break across a wide range of temperatures.

(5) The table below lists the post-solidification dielectric constants and other physical properties of the dielectric film of the present invention (example 1) and a conventional dielectric film (comparative example 1). It can be seen that the dielectric film of the present invention has excellent characteristics.

TABLE 2

General characteristics

| Item | | Example 1 | Comparative Example 1 |
|---|---|---|---|
| Dielectric constant | 3 GHz | 2.8 | 4.1 |
| Dielectric loss factor | 3 GHz | 0.015 | 0.039 |
| 18 μm | kN/m | 1.1 | 1.1 |
| Tg DMA | ° C. | 175 | 165 |
| Barcol hardness 934-1 | 23° C. | 70.7 | 65 |
| Water absorption | 23° C., 24 h | 0.52 | 1.11 |
| Flame resistance (UL94) | — | VO | VO |

While the invention has been illustrated and described in accordance with preferred embodiments, it is not intended to be limited thereto. Rather, variations and changes may be made thereto without departing from the invention as set forth in the following claims.

What is claimed is:

1. A dielectric film for a printed wiring board comprising a base material of drawn porous polytetrafluoroethylene film impregnated with an adhesive or fusible resin and having a post-solidification tensile modulus of elasticity of 0.1 to 1.8 GPa and a tensile elongation at break (at 25° C.) of at least 4.0%.

2. A printed wiring board comprising a multilayer board having a plurality of circuit layers, wherein at least one layer of the multilayer board has an insulating/adhesive layer; a drawn porous polytetrafluoroethylene film as the base material for the insulating/adhesive layer; said base material impregnated with an adhesive or fusible resin; a tensile modulus of elasticity of 0.1 to 1.8 GPa; and a tensile elongation at break (at 25° C.) of at least 4.0%.

3. The printed wiring board according to claim 2, wherein an outermost layer of the multilayer board has said insulating/adhesive layer.

4. A semiconductor device comprising a multilayer printed wiring board having a plurality of circuit layers, and a semiconductor element mounted on said multilayer printed wiring board, said semiconductor device comprising an insulating/adhesive layer between an outermost circuit layer of said multilayer board and a circuit layer adjacent thereto, and a drawn porous polytetrafluoroethylene film as a base material for said insulating/adhesive layer; said base material impregnated with an adhesive or fusible resin; and wherein the tensile modulus of elasticity is 0.1 to 1.8 GPa; and the tensile elongation at break (at 25° C.) is at least 4.0%.

5. The semiconductor device according to claim 4, wherein said semiconductor element is flip-chip mounted on the multilayer printed wiring board.

* * * * *